(12) United States Patent
Dong et al.

(10) Patent No.: US 10,922,518 B2
(45) Date of Patent: Feb. 16, 2021

(54) CHIP PACKAGE STRUCTURE, CHIP PACKAGE METHOD AND TERMINAL DEVICE

(71) Applicant: SHENZHEN GOODIX TECHNOLOGY CO., LTD., Shenzhen (CN)

(72) Inventors: Haoxiang Dong, Shenzhen (CN); Ya Wei, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 130 days.

(21) Appl. No.: 16/147,847

(22) Filed: Sep. 30, 2018

(65) Prior Publication Data
US 2019/0034687 A1 Jan. 31, 2019

Related U.S. Application Data

(63) Continuation of application No. PCT/CN2017/087452, filed on Jun. 7, 2017.

(51) Int. Cl.
*G06K 9/00* (2006.01)
*H01L 27/146* (2006.01)
*G06K 9/20* (2006.01)

(52) U.S. Cl.
CPC .......... *G06K 9/0004* (2013.01); *G06K 9/209* (2013.01); *H01L 27/14618* (2013.01); *H01L 27/14627* (2013.01); *H01L 27/14636* (2013.01); *H01L 27/14678* (2013.01); *H01L 27/14687* (2013.01); *H01L 2224/11* (2013.01)

(58) Field of Classification Search
None
See application file for complete search history.

(56) References Cited

U.S. PATENT DOCUMENTS

| 8,058,737 B2 | 11/2011 | Hasegawa et al. |
| 8,174,090 B2 * | 5/2012 | Wang ................ H01L 27/14618 257/459 |
| 9,350,906 B2 | 5/2016 | Shiung et al. |

(Continued)

FOREIGN PATENT DOCUMENTS

| CN | 101661930 A | * | 3/2010 | ....... H01L 27/14627 |
| CN | 101661930 A | | 3/2010 | |

(Continued)

*Primary Examiner* — Michelle Mandala

(57) ABSTRACT

Embodiments of the present application provide a chip package structure, a chip package method and a terminal device. The chip package structure includes: an optical sensing chip, including a first surface and a second surface, where the first surface is provided with a first pad, the second surface is provided with a connecting end, the first pad is electrically connected to the connecting end, and the connecting end is configured to implement an electrical connection between the chip package structure and the exterior; and an optical path modulating structure, disposed above the first surface, and configured to perform an optical path modulation on an optical signal reflected from a human finger and make the signal incident on the first surface, or perform the optical path modulation on an optical signal emitted from the first surface and make the signal exit to the human finger.

14 Claims, 6 Drawing Sheets

(56) References Cited

U.S. PATENT DOCUMENTS

| | | |
|---|---|---|
| 2009/0068798 A1 | 3/2009 | Oliver et al. |
| 2009/0166873 A1 | 7/2009 | Yang et al. |
| 2010/0052192 A1 | 3/2010 | Hasegawa et al. |
| 2010/0085473 A1 | 4/2010 | Shiung et al. |
| 2011/0032400 A1 | 2/2011 | Yang |
| 2012/0056292 A1 | 3/2012 | Suzuki et al. |
| 2013/0277785 A1 | 10/2013 | Chen et al. |
| 2013/0309786 A1 | 11/2013 | Yang |
| 2016/0197115 A1 | 7/2016 | Chen et al. |
| 2017/0098678 A1 | 4/2017 | Lai et al. |
| 2018/0204866 A1* | 7/2018 | Hsieh ................ H01L 27/14636 |
| 2019/0074309 A1 | 3/2019 | Wang et al. |

FOREIGN PATENT DOCUMENTS

| | | | |
|---|---|---|---|
| CN | 101714564 A | 5/2010 | |
| CN | 101997013 A * | 3/2011 | ....... H01L 27/14618 |
| CN | 101997013 A | 3/2011 | |
| WO | 2017071426 A1 | 5/2017 | |

\* cited by examiner

CHIP PACKAGE STRUCTURE, CHIP PACKAGE METHOD AND TERMINAL DEVICE

The present application is a continuation of international application No. PCT/CN2017/087452, filed on Jun. 7, 2017, which is hereby incorporated by reference in its entirety.

TECHNICAL FIELD

Embodiments of the present application relate to the field of chip package, and in particular, to a chip package structure, a chip package method and a terminal device.

BACKGROUND

With the development of the mobile phone industry, the traditional capacitive fingerprint identification technology has gradually been unable to meet the requirements of the emerging mobile phone market due to its limited penetrability, complicated chip structure, thick module size, limited placement position and other drawbacks; and the optical fingerprint identification technology will gradually become the mainstream of fingerprint identification technology due to its strong penetrability, support for full screen placement and other features.

However, most of optical sensing chips supporting the optical fingerprint identification technology are mounted below the screen of the mobile phone, occupying the space position of the battery of the mobile phone. Therefore, how to implement a thinner and smaller package structure of the optical sensing chip becomes an urgent problem to be solved.

SUMMARY

Embodiments of the present application provide a chip package structure, a chip package method and a terminal device, which could reduce the thickness and size of the package structure.

In a first aspect, a chip package structure is provided. The chip package structure includes: an optical sensing chip, including a first surface and a second surface, where the first surface is provided with a first pad, the second surface is provided with a connecting end, the first pad is electrically connected to the connecting end, and the connecting end is configured to implement an electrical connection between the chip package structure and the exterior; and an optical path modulating structure, disposed above the first surface, and configured to perform an optical path modulation on an optical signal reflected from a human finger and make the signal incident on the first surface, or perform an optical path modulation on an optical signal emitted from the first surface and make the signal exit to the human finger.

Therefore, in the chip package structure of an embodiment of the present application, the package integration level is improved by packaging the optical sensing chip and the optical path modulating structure in one chip package structure. Instead of using the substrate and bond wire of the traditional package technology, an electrical connection between the optical sensing chip and the exterior is implemented by electrically connecting the pad of the first surface of the optical sensing chip to the second surface of the optical sensing chip, thus reducing the thickness and size of the chip package structure. Furthermore, the chip package structure with the reduced thickness and size can be better applied to a terminal device with a higher requirement on the thickness.

In some possible implementations, a Through Silicon Via TSV is disposed between the first pad and the connecting end, and the first pad is electrically connected to the connecting end through a Redistribution Layer RDL in the TSV.

In other words, an electrical connection between the first pad and the connecting end as well as an electrical connection between the connecting end and the exterior, which is also equivalent to an electrical connection between the first pad and the exterior, may be implemented through a TSV process; therefore, the purpose of guiding an electric signal from the optical sensing chip to the exterior of the chip package structure can be achieved by guiding the first pad on the first surface of the optical sensing chip to the second surface.

In some possible implementations, the connecting end is a second pad or a solder ball.

In other words, a port for implementing the electrical connection between the chip package structure and the exterior may be in the form of a pad or a solder ball, and the specific form may be determined according to the requirement of the customer.

Optionally, the solder ball is formed using a ball placement process, or a stencil printing process combined with a reflow soldering process.

In some possible implementations, the chip package structure further includes:

an injection molding layer, coating the optical sensing chip and the optical path modulating structure, and configured to fix and protect the optical sensing chip and the optical path modulating structure.

If the chip package structure includes the injection molding layer, the connecting end is exposed from the surface of the injection molding layer.

For instance, the injection molding layer may coat lateral sides of the optical sensing chip and the optical path modulating structure, or the injection molding layer may also coat the lateral sides of the optical sensing chip and the optical path modulating structure, and the second surface of the optical sensing chip. In order to ensure the transmission of an optical signal between the optical path modulating structure and the optical sensing chip, the injection molding layer may not covered the position where the transmission of the optical signal between the optical path modulating structure and the optical sensing chip is performed. That is, a surface of the optical path modulating structure is at least exposed from the injection molding layer, where the surface is used for receiving the optical signal. If a surface exposed from the optical path modulating structure is referred to as a third surface, and a surface adjacent to the optical path modulating structure and the first surface of the optical sensing chip is referred to as a fourth surface, the injection molding layer at least does not cover an optical region on the third surface of the optical path modulating structure.

In other words, if the chip package structure includes the injection molding layer, the injection molding layer at least does not coat the surface of the optical path modulating structure, where the surface is used for receiving the optical signal, and the position of the connecting end on the second surface, so as to ensure that the optical path modulating structure can receive an optical signal from a human finger and emit an optical signal to the human finger, and ensure that the connecting end can implement an electrical connection to the exterior.

Optionally, the injection molding layer may be a plastic sealant or Epoxy Molding Compound (EMC).

Optionally, the injection molding layer is formed using a molding process or an open molding process.

In some possible implementations, the connecting end is exposed from the surface of the injection molding layer by means of grinding or laser drilling.

Optionally, the optical path modulating structure is a lens structure, such as a convex lens structure, a concave lens structure, a combined structure of a convex lens and a concave lens, or other structures that can be used for an optical path modulation.

In some possible implementations, the optical path modulating structure is disposed above the first surface in at least one of the following ways:

pasting with a transparent glue, pasting with a transparent film, performing edge lamination with the transparent film and performing edge lamination with green oil.

In some possible implementations, the optical path modulating structure is prepared on the first surface using a stencil printing process or an exposure and developing process.

Optionally, a material for connecting the optical path modulating structure and the optical sensing chip may include at least one of the followings: Thermal Compression Non-Conductive Paste (TCNCP), Thermal Compression Non-Conductive Film (TCNCF), Die Attach Film (DAF), Epoxy or the like.

In a second aspect, a chip package method is provided. The chip package method includes: bonding a wafer of an optical path modulating structure and a wafer of an optical sensing chip, to obtain a reconstructed wafer, where the wafer of the optical sensing chip includes a plurality of optical sensing chips; electrically connecting a first pad of a first surface of the optical sensing chip in the reconstructed wafer to a second surface of the optical sensing chip, and generating a second pad, where the second pad is configured to implement an electrical connection between the optical sensing chip and the exterior; and performing wafer dicing on the processed reconstructed wafer, to obtain a die package particle. A chip package structure obtained through the above processing procedure is a combined structure including the optical sensing chip and the optical path modulating structure corresponding thereto.

In one possible implementation, the wafer of the optical path modulating structure and the wafer of the optical sensing chip may be bonded together by means of eutectic bonding, or the optical path modulating structure may also be directly prepared on the first surface of the wafer of the optical sensing chip, for instance, the optical path modulating structure may be directly prepared on the first surface of the optical sensing chip by means of exposing and developing or stencil printing.

Therefore, in the chip package method of an embodiment of the present application, the package integration level is improved by packaging the optical sensing chip and the optical path modulating structure in one chip package structure. Instead of using the substrate and bond wire of the traditional package technology, an electrical connection between the optical sensing chip and the exterior is implemented by electrically connecting the pad of the first surface of the optical sensing chip to the second surface of the optical sensing chip, thus reducing the thickness and size of the chip package structure. Furthermore, the chip package structure with the reduced thickness and size can be better applied to a terminal device with a higher requirement on the thickness.

In some possible implementations, the method further includes: performing molding processing on the die package particle, and forming an injection molding layer in the periphery of the die package particle, where the injection molding layer is configured to fix and protect the optical sensing chip and the optical path modulating structure; and exposing the position of the second pad from a surface of the injection molding layer by means of grinding or laser drilling.

In other words, the chip package structure prepared by the chip package method according to the embodiment of the present application may further include the injection molding layer, configured to fix and protect the optical sensing chip and the optical path modulating structure.

In some possible implementations, the method further includes: performing open molding processing on the die package particle, and forming an injection molding layer in the periphery of the die package particle, where the injection molding layer is configured to fix and protect the optical sensing chip and the optical path modulating structure.

Optionally, the method further includes: forming a solder ball at the position of the second pad using a stencil printing process combined with a reflow soldering process, or a ball placement process.

In this case, the obtained chip package structure includes a combined structure of the optical sensing chip and the optical path modulating structure corresponding thereto, as well as the solder ball, or it may further include the injection molding layer.

In some possible implementations, the electrically connecting the first pad on the first surface of the optical sensing chip in the reconstructed wafer to the second surface of the optical sensing chip, and generating the second pad includes: disposing a TSV between the first pad and the second surface using a TSV process; and electrically connecting the first pad to the second surface through a RDL in the TSV, and generating the second pad.

In a third aspect, a chip package method is provided. The chip package method includes: electrically connecting a first pad of a first surface of an optical sensing chip in a wafer of the optical sensing chip to a second surface of the optical sensing chip, and generating a second pad, where the second pad is configured to implement an electrical connection between the optical sensing chip and the exterior, and the wafer of the optical sensing chip includes a plurality of optical sensing chips; performing wafer dicing on the processed wafer of the optical sensing chip, to obtain a single optical sensing chip; and bonding the single optical sensing chip and an optical path modulating structure, to obtain a die package particle.

Therefore, in the chip package method of an embodiment of the present application, the package integration level is improved by packaging the optical sensing chip and the optical path modulating structure in one chip package structure. Instead of using the substrate and bond wire in the traditional package technology, the electrical connection between the optical sensing chip and the exterior is implemented by electrically connecting the pad of the first surface of the optical sensing chip to the second surface of the optical sensing chip, thus reducing the thickness and size of the chip package structure. Furthermore, the chip package structure with the reduced thickness and size can be better applied to a terminal device with a higher requirement on the thickness.

In some possible implementations, the method further includes: performing molding processing on the die package particle, and forming an injection molding layer in the periphery of the die package particle, where the injection molding layer is configured to fix and protect the optical sensing chip and the optical path modulating structure; and exposing the position of the second pad from a surface of the injection molding layer by means of grinding or laser drilling.

In some possible implementations, the method further includes: performing open molding processing on the die package particle, and forming an injection molding layer in the periphery of the die package particle, where the injection molding layer is configured to fix and protect the optical sensing chip and the optical path modulating structure.

In this case, the obtained chip package structure includes a combined structure of the optical sensing chip and the optical path modulating structure corresponding thereto as well as the injection molding layer.

In some possible implementations, the method further includes: forming a solder ball at the position of the second pad using a stencil printing process combined with a reflow soldering process, or a ball placement process.

In this case, the obtained chip package structure includes a combined structure of the optical sensing chip and the optical path modulating structure corresponding thereto, as well as the solder ball, or it may further include the injection molding layer.

In some possible implementations, the electrically connecting the first pad on the first surface of the optical sensing chip in the wafer of the optical sensing chip to the second surface of the optical sensing chip, and generating the second pad includes: disposing a TSV between the first pad and the second surface using a TSV process; and electrically connecting the first pad to the second surface through a RDL in the TSV, and generating the second pad.

In a fourth aspect, a terminal device is provided. The terminal device includes the chip package structure of the first aspect and any one of possible implementations of the first aspect.

Optionally, the terminal device may further include a screen, and the chip package structure is disposed below the screen.

In a fifth aspect, a terminal device is provided. The terminal device includes a chip package structure prepared by the chip package method according to the second aspect and any one of possible implementations of the second aspect.

Optionally, the terminal device may further include a screen, and the chip package structure is disposed below the screen.

In a sixth aspect, a terminal device is provided. The terminal device includes a chip package structure prepared by the chip package method according to the third aspect and any one of possible implementations of the third aspect.

Optionally, the terminal device may further include a screen, and the chip package structure is disposed below the screen.

Therefore, in the chip package structure of an embodiment of the present application, the package integration level is improved by packaging the optical sensing chip and the optical path modulating structure together. Instead of using the substrate and bond wire of the traditional package technology, an electrical connection between the optical sensing chip and the exterior is implemented by electrically connecting the first pad on the first surface of the optical sensing chip to the connecting end of the second surface, thus reducing the thickness and size of the chip package structure.

DESCRIPTION OF EMBODIMENTS

A clear description of technical solutions of the embodiments of the present application will be given below, in combination with the accompanying drawings in the embodiments of the present application.

Chip package structures of embodiments of the present application will be described in detail below with reference to FIGS. 1-8.

It should be noted that, to facilitate understanding, in the embodiments shown below, for the structures shown in different embodiments, the same structures are denoted by the same reference numbers, and a detailed explanation for the same structure is thus omitted for brevity.

It should be understood that, the heights or thicknesses of various structural members and the overall thickness of the chip package structure in the embodiments of the present application shown below are merely illustrative, and should not be intended to impose any limitation on the present application.

Figure 1:
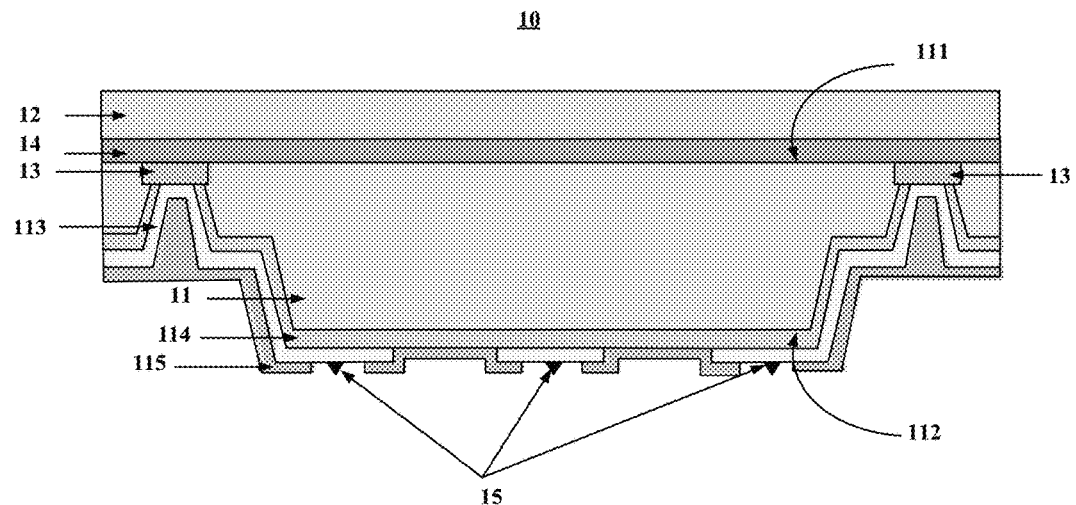
FIG. 1 is a schematic diagram of a chip package structure according to an embodiment of the present application.

FIG. 1 is a schematic structural diagram of a chip package structure 10 according to an embodiment of the present application. As shown in FIG. 1, the chip package structure 10 comprises: an optical sensing chip 11 and an optical path modulating structure 12.

As shown in FIG. 1, the optical sensing chip 11 has a first surface 111 and a second surface 112. It should be noted that, before the optical sensing chip 11 enters a chip package factory, one surface thereof has been prepared with a pad, such as a first pad 13 shown in FIG. 1, and the first pad 13 may be understood as a pin for connecting the optical sensing chip 11 and the exterior. In an embodiment of the present application, the first surface 111 of the optical sensing chip 11 is a surface on which an pad has been prepared before the optical sensing chip enters the chip package factory, while a surface opposite to the first surface 111 is the second surface 112 of the optical sensing chip 11, and the second surface 112 is not prepared with an pad before the optical sensing chip enters the package plant.

It should be understood that, the first surface 111 of the optical sensing chip 11 may include a plurality of first pads 13, and the plurality of first pads 13 may be evenly or unevenly distributed on the first surface 111 of the optical sensing chip 11; the number and the position of the first pad 13 in the chip package structure 10 shown in FIG. 1 are only presented as an example but not limitation.

In an embodiment of the present application, the first pad 13 of the optical sensing chip 11 may be electrically connected to the second surface 112 of the optical sensing chip 11. Specifically, the first pad 13 may be electrically connected to a connecting end 15 on the second surface 112, such as connecting ends 15 shown in FIG. 1, and the connecting end 15 is configured to implement an electrical connection between the optical sensing chip 11 and the exterior. Before the optical sensing chip enters the chip package factory, the second surface 112 does not have the connecting end 15, and the connecting end 15 on the second surface 112 is prepared after the optical sensing chip 11 enters the chip package factory.

Specifically, the first pad 13 may first be exposed from the second surface 112 of the optical sensing chip 11 using a Through Silicon Via (TSV) process, and the connecting end 15 is generated at a position where the first pad 13 is exposed from the second surface 112, or the first pad 13 may also be guided to a designate position on the second surface 112, and the connecting end 15 is generated at the designate position. The embodiment of the present application does not particularly define the specific position of the connecting end 15 on the second surface 112, as long as the first pad 13 on the first surface 111 of the optical sensing chip 11 is electrically connected to the second surface 112, which falls into the protection scope of the embodiment of the present application.

It should be noted that, the number and the position of the connecting ends 15 shown in FIG. 1 are only presented as an example but not limitation. The number of the first pad 13 and the number of the connecting end 15 may be the same or different; for example, one first pad 13 may correspond to one connecting end 15, or a plurality of first pads 13 may also correspond to one connecting end 15, etc., and it is not particularly limited in the embodiment of the present application.

Optionally, the connecting end 15 may be a second pad or a solder ball, or other connecting members for implementing an electrical connection between the optical sensing chip and the exterior, and it is not particularly limited in the embodiment of the present application.

Specifically, after the first pad 13 is electrically connected to the second surface 112, the second pad may be generated on the second surface 112, and the electrical connection between the optical sensing chip and the exterior is implemented through the second pad; or furthermore, the solder ball may be generated at the position of the second pad, and the electrical connection between the optical sensing chip and the exterior is implemented through the solder ball.

How to implement the electrical connection between the first pad 13 and the connecting end 15 will be explained in detail below with reference to FIG. 1:

first, exposing the first pad 13 of the first surface 111 from the second surface 112 using a TSV process, and forming a TSV between the first surface 111 and the second surface 112, where the TSV has a Redistribution Layer (RDL), such as a RDL 113 shown in FIG. 1;

then, spin coating a passivation layer, such as a first passivation layer 114 shown in FIG. 1, on the second surface 112 of the optical sensing chip 11 and an inner wall of the TSV;

next, electrically connecting the first pad 13 to the second surface 112 through the RDL 113 of the TSV, and generating the second pad;

later, once again spin coating a passivation layer, such as a second passivation layer 115 shown in FIG. 1, on the second surface 112 of the optical sensing chip 11 and the inner wall of the TSV, thus the position of the second pad is covered by the second passivation layer 115;

finally, performing open processing on the position of the second pad on the second surface 112, to expose the position of the second pad on the second surface from the second passivation layer 115.

If the connecting end 15 is the second pad, an electrical connection between the first pad and the second pad has been implemented through the above steps; or if the connecting end 15 is the solder ball, furthermore, an electrical connection between the first pad and the solder ball may be implemented by generating the solder ball at the position of the second pad.

Figure 2:
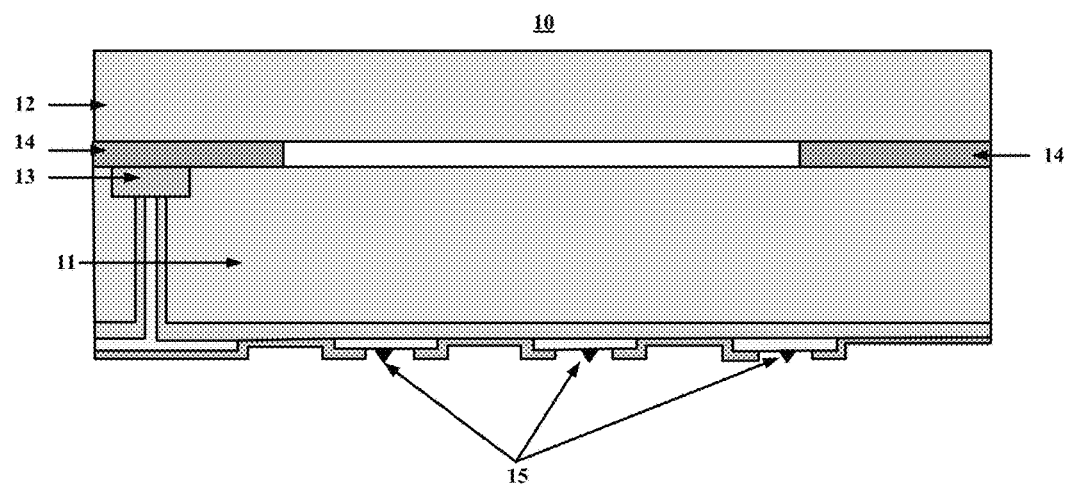
FIG. 2 is a schematic structural diagram of a chip package structure according to another embodiment of the present application.

Optionally, in an embodiment of the present application, the TSV process may include a inclined hole TSV process and a straight hole TSV process; in other words, the TSV for implementing an interconnection between the first pad on the first surface and the connecting end on the second surface may be a stepped via as shown in FIG. 1, or a straight hole as shown in FIG. 2.

In general, the TSV may be formed between the first surface 111 and the second surface 112 using the TSV process; the first pad 13 may be electrically connected to the second surface 112 through the TSV; the connecting end 15 may then be generated on the second surface, where the connecting end 15 may be in the form of the pad or the solder ball; since the first pad 13 is electrically connected to the connecting end 15, the electrical connection between the connecting end 15 and the exterior is equivalent to the electrical connection between the first pad 13 and the exterior; therefore, in the chip package structure of the embodiment of the present application, the purpose of guiding an electrical signal of the optical sensing chip to the exterior of the chip package structure can be achieved by guiding the first pad on the first surface of the optical sensing chip to the second surface.

In an embodiment of the present application, the optical path modulating structure 12 is disposed above the first surface 111 of the optical sensing chip 11; for instance, the optical path modulating structure 12 may be tightly adhered to the first surface 111 of the optical sensing chip 11. In one possible implementation, the optical path modulating structure 12 may be directly prepared on the first surface 111 of the optical sensing chip 11; for instance, the optical path modulating structure 12 may be directly prepared on the first surface 111 of the optical sensing chip 11 by means of exposing and developing or stencil printing.

Alternatively, as shown in FIG. 1, the first surface 111 of the optical sensing chip 11 and the optical path modulating structure 12 may be connected through a connector 14, and the connector 14 may be a light transmissive adhesive material such as a transparent glue, a transparent film or green oil. Specifically, the first surface 111 of the optical sensing chip 11 and the optical path modulating structure 12 may be partly (as shown in FIG. 2) or all (as shown in FIG.

Figure 3:
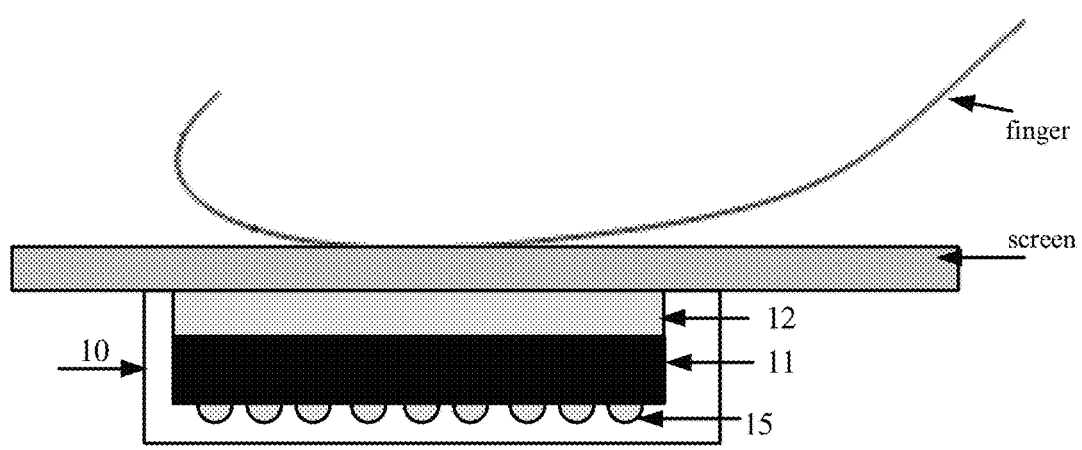
FIG. 3 is a schematic diagram of an application scenario of a chip package structure of an embodiment of the present application.

1) connected through the connector 14, and it is not particularly limited in the embodiment of the present application. In the practical application, as shown in FIG. 3, the chip package structure 10 may be mounted below a screen of a terminal device, and the connecting end 15 may be configured to implement an electrical connection between the chip package structure 10 or the optical sensing chip 11 and other chips on the terminal device. In this way, an optical signal emitted from the screen of the terminal device enters the screen after being reflected by a human finger, and then reaches the chip package structure 10; an optical signal incident on the chip package structure 10 first reaches the optical path modulating structure 12, and is imaged on the first surface of the optical sensing chip 11 after an optical path modulation performed by the optical path modulating structure 12; the optical sensing chip 11 may collect the incident optical signal and convert it into an electric signal, so as to acquire fingerprint information of the human finger; the optical sensing chip 11 may then output the acquired fingerprint information of the human body to other chips electrically connected to the chip package structure 10 through the connecting end 15, such as to a processing chip of the terminal device, so that the processing chip performs fingerprint identification and other subsequent operations according to the fingerprint information.

It should be understood that, in an embodiment of the present application, the optical sensing chip is a combined structure integrated with a logic circuit and an optical fingerprint sensor, i.e., the optical sensing chip has the functions of the optical fingerprint sensor and logic processing, and can realize the function of collecting an optical image signal of the human finger and converting it into an electric signal. The optical path modulating structure is a structure with an optical path modulating function; optionally, the optical path modulating structure may be a lens structure, such as a convex lens structure, a concave lens structure, a combined structure of a convex lens and a concave lens, or other structures that can be used for the optical modulation, and it is not particularly limited in the embodiment of the present application.

Therefore, in the chip package structure of the embodiment of the present application, the package integration level is improved by packaging the optical sensing chip and the optical path modulating structure in one chip package structure. Instead of using the substrate and bond wire of the traditional package technology, the electrical connection between the optical sensing chip and the exterior is implemented by electrically connecting the pad of the first surface of the optical sensing chip to the second surface of the optical sensing chip, thus reducing the thickness and size of the chip package structure. Furthermore, the chip package structure with the reduced thickness and size can be better applied to a terminal device with a higher requirement on the thickness.

Figure 4:
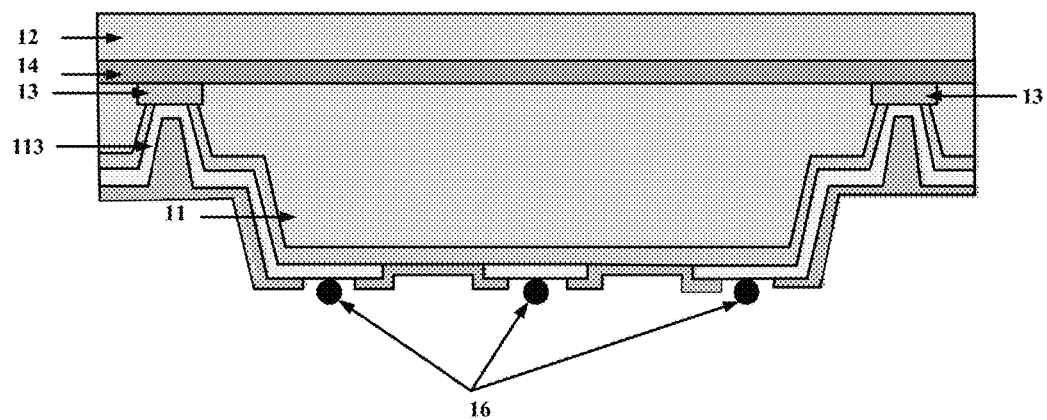
FIG. 4 is a schematic structural diagram of a chip package structure according to yet another embodiment of the present application.

As previously mentioned, the connecting end for implementing the electrical connection between the chip package structure and the exterior may be in the form of the pad or the solder ball, and the specific form of the connecting end may be set according to the customer's demand; if the customer selects to use the pad, the second pad may be generated at the position of the connecting end 15, and under such circumstance, the first pad 13 is electrically connected to the second pad, and the electrical connection between the first pad 13 and the exterior may be implemented through the second pad, i.e., the electrical connection between the optical sensing chip 11 and the exterior is implemented. Or if the customer selects to use the solder ball, the connecting end 15 may be the solder ball 16, i.e., the solder ball 16 may be implanted at the position of the second pad, as shown in FIG. 4, and the electrical connection between the optical sensing chip 11 and the exterior is implemented through the solder ball 16.

It can be appreciated by those skilled in the art that, the solder ball 16 may be formed using a ball placement process, or a stencil printing process combined with a reflow soldering process, or it may also be formed using a grinding process on the basis of the above processes; by way of example but not limitation, the grinding process may be a Strip Grinding process.

Optionally, in an embodiment of the present application, the chip package structure 10 may also include an injection molding layer, configured to fix and protect the optical sensing chip 11 and the optical path modulating structure 12; the injection molding layer at least coats lateral sides of the optical sensing chip 11 and the optical path modulating structure 12, so that the optical sensing chip 11 and the optical path modulating structure 12 may be fixed together, so as to reduce a relative motion of the optical sensing chip 11 and the optical path modulating structure 12, protect the optical sensing chip 11 and the optical path modulating structure 12 from being destroyed by external force and improve the reliability of the chip package structure.

It should be noted that, in order to ensure the transmission of an optical signal between the optical path modulating structure and the optical sensing chip, the injection molding layer may not cover the position where the transmission of the optical signal between the optical path modulating structure and the optical sensing chip is performed. That is, a surface of the optical path modulating structure is at least exposed from the injection molding layer, where the surface is used for receiving the optical signal. If the surface exposed from the optical path modulating structure is referred to as a third surface, and a surface adjacent to the optical path modulating structure and the first surface of the optical sensing chip is referred to as a fourth surface, the injection molding layer does not cover an optical region on the third surface of the optical path modulating structure.

Figure 5:
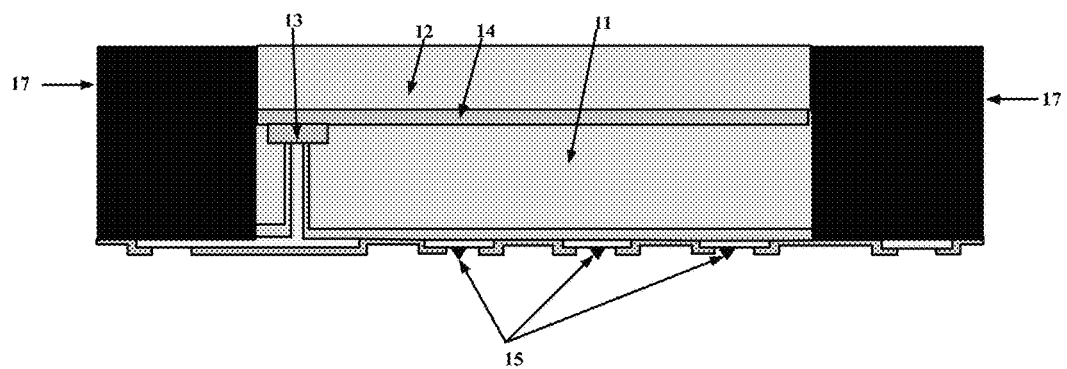
FIG. 5 is a schematic structural diagram of a chip package structure according to yet another embodiment of the present application.
Figure 6:
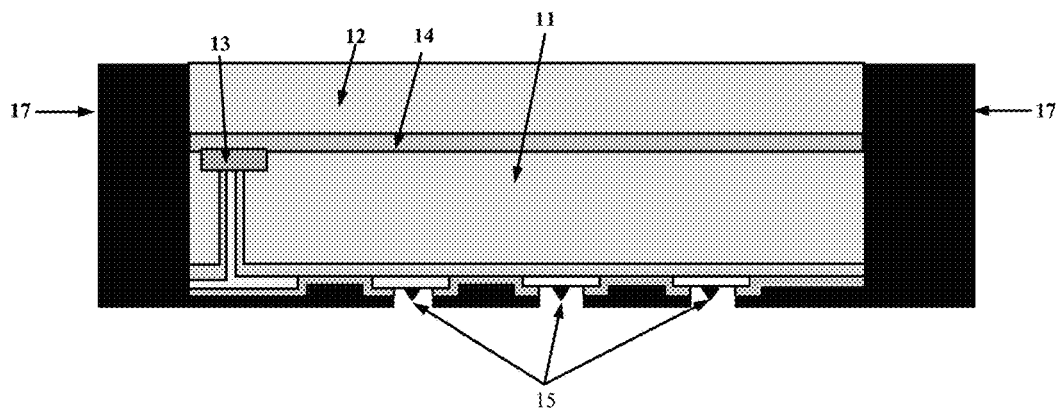
FIG. 6 is a schematic structural diagram of a chip package structure according to yet another embodiment of the present application.

Optionally, the injection molding layer may only coat lateral sides of the optical sensing chip and the optical path modulating structure, as shown in FIG. 5. Or the injection molding layer may also coat the lateral sides of the optical sensing chip and the optical path modulating structure, as well as the second surface of the optical sensing chip, as shown in FIG. 6.

Since the connecting end 15 is disposed on the second surface 112 of the optical sensing chip 11, and the connecting end 15 is configured to implement the electrical connection between the chip package structure 10 and the exterior, the connecting end 15 on the second surface needs to be exposed from the surface of an injection molding layer 17.

In one possible implementation, when the injection molding layer 17 is formed, the position of the connecting end 15 may be reserved in advance, i.e., molding processing is not performed on the position of the connecting end 15; thus after forming the injection molding layer 17, the connecting end 15 is exposed, and no further processing needs to be performed on the injection molding layer.

In another possible implementation, the position of the connecting end 15 is not reserved in advance; thus after forming the injection molding layer 17, the injection molding layer 17 covers the connecting end 15, i.e., the injection molding layer 17 coats the position of the connecting end 15, and further processing needs to be performed on the injection molding layer 17, so that the connecting end 15 is exposed from the injection molding layer 17. For instance, the connecting end 15 may be exposed from the injection molding layer 17 by means of grinding the injection molding layer 17 or laser drilling.

Figure 7:
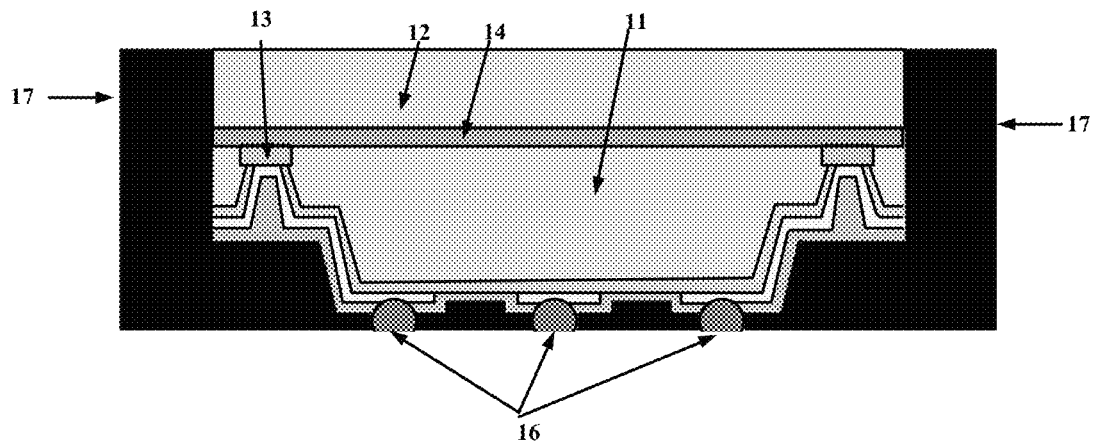
FIG. 7 is a schematic structural diagram of a chip package structure according to yet another embodiment of the present application.
Figure 8:
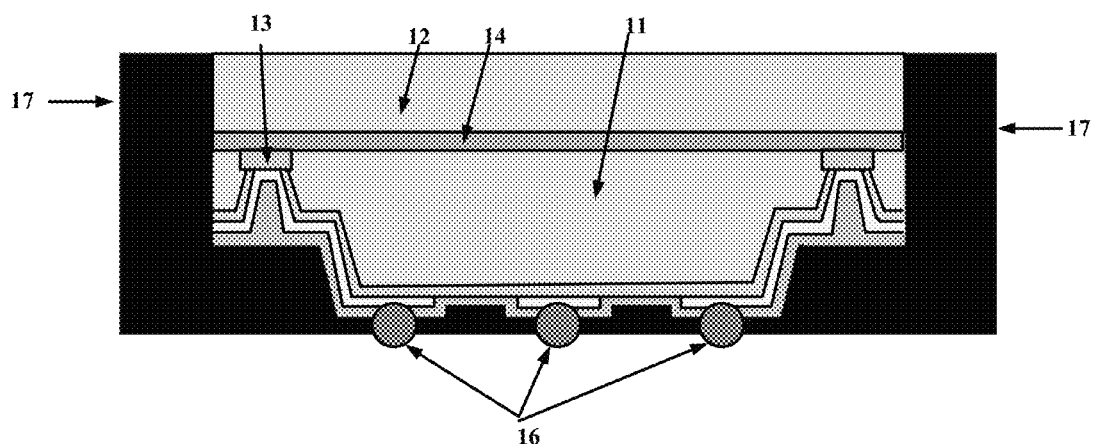
FIG. 8 is a schematic structural diagram of a chip package structure according to yet another embodiment of the present application.

If the connecting end 15 is the solder ball 16, the chip package structure 10 after grinding processing is shown in FIG. 7, and the chip package structure 10 after laser drilling processing is shown in FIG. 8.

It should be understood that, the way of exposing the connecting end from the injection molding layer by means of grinding the injection molding layer and laser drilling shown in the embodiment of the present application is merely illustrative, and should not be intended to impose any limitation on the present application. In an embodiment of the present application, the connecting end may be exposed from the injection molding layer by means of first grinding and then laser drilling according to the demand.

It should be noted that, the chip package structures according to the embodiments of the present application are described in detail above in conjunction with FIGS. 1-8. However, the structures shown in FIGS. 1-8 are merely some possible implementations of the embodiments of the present application, and should not be intended to impose any limitation on the present application. For instance, the chip package structure may or may not include the solder ball, or may or may not include the injection molding layer, and the position of the injection molding layer may also be adjusted according to the actual condition, as long as the chip package structure includes the optical sensing chip and the optical path modulating structure, and the electrical connection between the optical sensing chip and the exterior is implemented by guiding a circuit of the first surface of the optical sensing chip to the second surface, which falls into the protection scope of the present application.

Hereinafter, to facilitate the understanding, chip package structures of embodiments of the present application are described in detail in combination with several chip package methods (including package method I to package method V); however, it should be understood that, the chip package methods shown below are merely some possible implementations for implementing the chip package structures of the embodiments of the present application, and should not be intended to impose any limitation on the present application; the embodiments of present application should not be limited thereto either.

Package Method I:

First, a step 1a is performed: performing wafer-level bonding on a wafer of an optical sensing chip and a wafer of an optical path modulating structure, where a bonding material may be a light transmissive adhesive material, and by way of example but not limitation, the light transmissive adhesive material may include at least one of the followings: Thermal Compression Non-Conductive Paste (TCNCP), Thermal Compression Non-Conductive Film (TCNCF), Die Attach Film (DAF), Epoxy or the like.

In one possible implementation, the wafer-level bonding may also be performed on the wafer of the optical sensing chip and the wafer of the optical path modulating structure by means of edge lamination, and the embodiment of the present application does not define a connection manner between the wafer of the optical sensing chip and the wafer of the optical path modulating structure.

In another possible implementation, the wafer of the optical path modulating structure and the wafer of the optical sensing chip may also be bonded by means of eutectic bonding. Or the optical path modulating structure may also be directly prepared on the first surface of the wafer of the optical sensing chip; for instance, the optical path modulating structure may be directly prepared on the first surface of the optical sensing chip by means of exposing and developing or stencil printing.

It should be noted that, the wafer of the optical sensing chip includes a plurality of optical sensing chips; the wafer of the optical path modulating structure may be cut into a plurality of optical path modulating structures matched with the optical sensing chip according to a size of the optical sensing chip; a chip package structure of an embodiment of the present application may include a single optical sensing chip and an optical path modulating structure corresponding thereto, i.e., the single optical sensing chip and the optical path modulating structure corresponding thereto may be packaged together, so as to form the chip package structure of the embodiment of the present application. Or the chip package structure of the embodiment of the present application may also include a plurality of optical sensing chips and optical path modulating structures corresponding thereto, or it may also be an original wafer of the optical sensing chip and an optical path modulating structure corresponding thereto.

The optical path modulating structure corresponding thereto herein refers to that the optical path modulating structure can cooperate with the optical sensing chip to implement the fingerprint collection function on the human finger. The size of the optical path modulating structure may be determined according to the size of the optical sensing chip; for instance, the size of the optical path modulating structure may be equal to or smaller than the size of the optical sensing chip; the embodiment of the present application does not particularly define the size of the optical path modulating structure, as long as the optical path modulating structure may cooperate with the optical sensing chip to implement the fingerprint collection function.

Then, a step 1b is performed: performing wafer thinning processing on a second surface of the wafer of the optical sensing chip.

It should be understood that, whether to perform thinning processing on the wafer and the degree of thinning the wafer may be determined according to the product need or process, and it is not particularly limited in the embodiment of the present application.

Next, a step 1c is performed: electrically connecting a first pad on a first surface of each optical sensing chip in the wafer of the optical sensing chip to a second surface of each optical sensing chip through a TSV process, and generating a second pad is on the second surface of each optical sensing chip.

The specific implementation procedure of the step 1c may refer to the relevant description of the foregoing embodiments, and for brevity, it will not be repeated redundantly herein.

A structure obtained through the above step 1a to step 1c may be referred to as a reconstructed wafer or a combined wafer.

Finally, a step 1d is performed: performing wafer dicing on the reconstructed wafer, to obtain a die package particle.

In the present embodiment, the die package particle is the chip package structure of the embodiment of the present application, such as the chip package structure 10 shown in FIGS. 1 and 2.

Package Method II:

The package method II includes a step 2a to a step 2e, where a step 2a to a step 2c are the same as the step 1a to the step 1c of the package method I, which will not be repeated redundantly herein.

In a step 2d, a solder paste is brushed at the position of the second pad reserved on the second surface of the optical sensing chip using a stencil printing process, and the solder paste is fused using a reflow soldering process to form a solder ball.

That is, in the present embodiment, the connecting end is the solder ball.

A structure obtained through the above step 2a to step 2d may be referred to as a reconstructed wafer, and the reconstructed wafer herein is the reconstructed wafer of the package method I combined with the solder ball.

Finally, a step 2e is performed: performing wafer dicing on the reconstructed wafer, to obtain a die package particle.

In the present embodiment, the die package particle is the chip package structure of the embodiment of the present application, such as the chip package structure 10 shown in FIG. 4.

The distinction of the package method II and the package method I lies in: in the package method I, the connecting end for implementing the electrical connection between the optical sensing chip and the exterior is the second pad; while, in the package method II, the connecting end for implementing the electrical connection between the optical sensing chip and the exterior is the solder ball.

Package Method III:

The package method III includes a step 3a to a step 3h, where a step 3a to a step 3d are the same as the step 2a to the step 2d of the package method II, which will not be repeated redundantly herein.

A reconstructed wafer is obtained after a step 3a to a step 3d.

Then, a step 3e is performed: performing wafer dicing on the reconstructed wafer, to obtain a die package particle, where the die package particle herein is a combined structure of the optical sensing chip and the optical path modulating structure.

Next, a step 3f is performed: attaching a third surface of the optical path modulating structure in the die package particle to a carrier, and then performing Molding processing.

The third surface of the optical path modulating structure is a surface exposed from the optical path modulating structure, or it may also be comprehended as a surface adjacent to a screen of a terminal device in the practical application. The carrier herein may be a glass, a ceramic, a metal, or other materials that have similar functions and are compatible with the wafer-level package process.

Optionally, a structural film and a functional film may be selectively coated on the carrier, such as an adhesive layer film, a sacrificial layer film, a buffer layer film, a dielectric layer film and the like. More particularly, both the adhesive layer film and the sacrificial layer film may be a Ultra-Violet (UV) curable adhesive, a light-to-heat conversion (LTHC) film or other materials that have similar functions and are compatible with the wafer-level process. The dielectric layer film may be polyimide (PI), PolyBenzoxazole (PBO), BenzoCycloButene (BCB), Ajinomoto Buildup Film (ABF), Solder Resist film (SR) or other materials that have similar functions and are compatible with the wafer-level process.

In other words, in an embodiment of the present application, the injection molding layer 17 may be a structure composed of various materials listed above.

It may be appreciated by those skilled in the art that, the carrier is a carrier that plays a support function in the chip package procedure; it does not belong to a chip package structure and is merely used for the package procedure; besides, the carrier may be removed after completing a corresponding step.

The injection molding layer is formed in the periphery of the optical path modulating structure and the optical sensing chip after the step 3f.

Later, a step 3g is performed: exposing the solder ball from the injection molding layer using a Strip Grinding process to grind one side of the injection molding layer where the solder ball is located.

In an embodiment of the present application, in the step 3f, molding processing may be performed on a plurality of package particles so that the injection molding layers in the periphery of the plurality of package particles are connected together; furthermore: cutting the injection molding layer of each package particle is performed in a step 3h, to obtain a die package body, and the die package body herein is the chip package structure of the present embodiment, such as the chip package structure 10 shown in FIG. 7.

Optionally, if, in the step 3f, the injection molding layer is formed using an Open Molding process, i.e., an exposed position of the solder ball on the second surface is reserved in advance; under such circumstance, the step 3g may not be performed since the solder ball has been already exposed from the injection molding layer; and under such circumstance, the obtained die package body is the chip package structure 10 shown in FIG. 8, and the solder ball 16 shown in FIG. 8 is a solder ball without grinding.

Optionally, if the above package method III does not include the step 3d, i.e., the chip package structure does not include the solder ball, and the connecting end 15 is the second pad, then in the step 3g, the position of the second pad may also be exposed by means of grinding or laser drilling, and under such circumstance, a structure formed after the step 3g may be the chip package structure 10 shown in FIG. 5 or 6.

The distinction of the package method III and the package method II lies in: the chip package structure 10 obtained through the package method III includes the injection molding layer 17.

Package Method IV:

The package method IV includes a step 4a to a step 4g, where a step 4a to a step 4d are the same as the step 1a to the step 1d of the package method I, which will not be repeated redundantly herein.

The die package particle is obtained after the above step 4a to step 4d, and the die package particle herein does not include a solder ball.

In a step 4e, a third surface of the optical path modulating structure in the die package particle is attached to a carrier, and then Molding processing is performed, to form an injection molding layer 17, which will not be repeated redundantly herein since the step 4e is the same as the step 3f in the package method III.

Then, a step 4f is performed: exposing the position of the second pad on the second surface from the injection molding layer 17 by means of laser drilling.

Next, a step 4g is performed: implanting a solder ball 16 at the position of the second pad.

Finally, a step 4h, being the same as the step 3h in the package method III, is performed, which will not be repeated redundantly herein; the die package body is obtained after the step 4h, and the die package body herein is the chip package structure of the present embodiment, such as the chip package structure 10 shown in FIG. 8.

Optionally, in the package method IV, if, in the step 4e, the injection molding layer 17 is formed using an Open Molding process, then the package method IV may not include the step 4f, i.e., laser drilling may not be performed at the position of the second pad.

The distinction of the package method IV and the package method III lies in: in the package method IV, the injection molding layer 17 is first prepared and the solder ball 16 is then implanted; while, in the package method III, the solder ball 16 is first generated and the injection molding layer 17 is then prepared. The similarity therebetween lies in: whether to first prepare the injection molding layer 17 or the solder ball 16, the solder ball 16 must finally be exposed from the bottom of the injection molding layer 17, so as to implement an electrical connection between the solder ball 16 and the exterior.

In the above package method I to package method IV, the wafer-level bonding is first performed on the wafer of the optical sensing chip and the wafer of the optical path modulating structure, and then the subsequent processing is performed, i.e., the subsequent processing procedure is processed on the basis of the reconstructed wafer. A chip package method that first processes an optical sensing chip and then performs a wafer-level bonding will be introduced below in conjunction with package method V.

Package Method V:

First, a step 5a is performed: performing thinning processing on a second surface of a wafer of an optical sensing chip.

The specific procedure is the same as the corresponding operation in the package method I to package method IV, which will not be repeated redundantly herein.

Then, a step 5b is performed: guiding a first pad on a first surface of the wafer of the optical sensing chip to the second surface of the wafer of the optical sensing chip through a TSV process, and generating a second pad, where the second pad herein is a pad for performing an electrical connection between the optical sensing chip and the exterior.

Optionally, if it is needed to implant a solder ball, a step 5c may further be performed: implanting the solder ball at the position of the second pad; otherwise, the step 5c may not be performed.

Next, a step 5d is performed: cutting the wafer of the optical sensing chip into a single optical sensing chip.

Later, a step 5e is performed: attaching a second surface of the single optical sensing chip obtained after processing by the step 5d to a carrier, and then pasting a cut optical path modulating structure to a first surface of the single optical sensing chip, and specifically, pasting the optical path modulating structure to the first surface of the optical sensing chip using a light transmissive adhesive material.

A structure obtained after the above steps is a die package particle, and the die package particle herein includes the single optical sensing chip and the optical path modulating structure corresponding thereto.

Furthermore, a step 5f may further be performed: performing molding processing on the die package particle, to form an injection molding layer 17. The specific executing procedure may refer to the relevant description of the foregoing embodiments, which will not be repeated redundantly herein.

Optionally, if the injection molding layer 17 is formed using a Molding process, the package method V further includes a step 5g: exposing the position of the second pad or the position of the solder ball by means of grinding or laser drilling.

Finally, a step 5h is performed: cutting the injection molding layer of each package particle, to obtain a die package body.

It should be noted that, in an embodiment of the present application, in one package body, a single or a plurality of optical sensing chip(s) may be integrated; in the practical executing procedure, the single or the plurality of optical sensing chip(s) (or an original wafer) may be packaged in one package body. When there are a plurality of optical sensing chips, the plurality of chips may be chips with different sizes, different types and different preparation processes, and the specific size thereof may be determined according to the product need and process; besides, grinding and thinning are performed on the chips according to the demand. Therefore, the present application does not particularly define the type, size and process of the target chip.

The embodiment of the present application merely takes one package body which is packaged by the single optical sensing chip and the optical path modulating structure corresponding thereto as an example; the chip package method according to the embodiment of the present application or a similar structure obtained by a modified form of the chip package method according to the embodiment of the present application falls into the protection scope of the embodiment of the present application.

Therefore, in the chip package structure of the embodiment of the present application, the package integration level is improved by packaging the optical sensing chip and the optical path modulating structure. Instead of using the substrate and bond wire of the traditional package technology, the electrical connection between the optical sensing chip and the exterior is implemented by electrically connecting the circuit of the first surface of the optical sensing chip to the connecting end on the second surface, thus reducing the thickness and size of the chip package structure, and the chip package structure with the reduced thickness and size can be better applied to a terminal device with a higher requirement on the thickness.

The chip package structures of the embodiments of the present application are described in detail above in conjunction with FIGS. 1-8. Chip package methods of embodiments of the present application will be described in detail below in conjunction with FIGS. 9-10.

Figure 9:
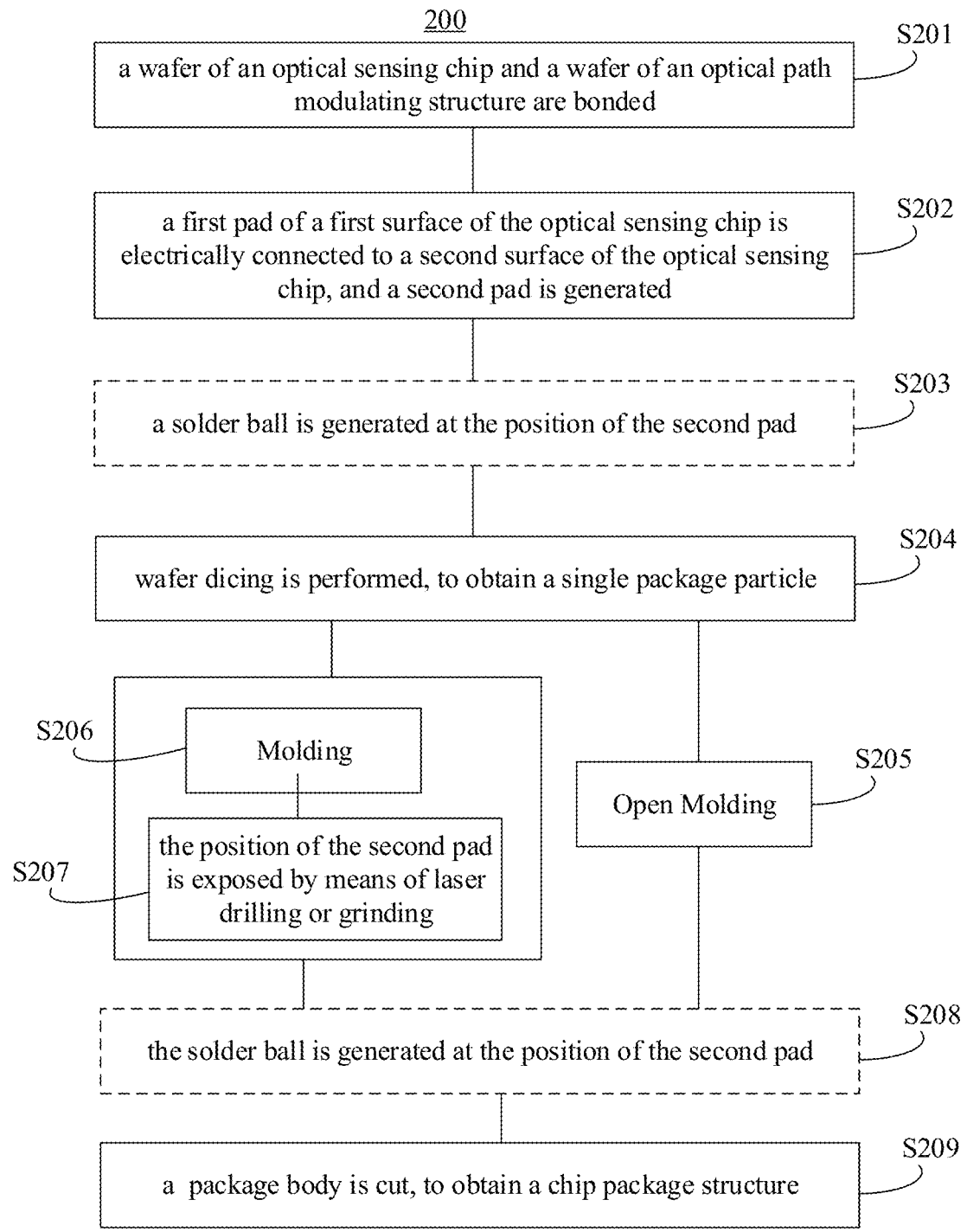
FIG. 9 is a schematic flowchart of a chip package method according to an embodiment of the present application.
Figure 10:
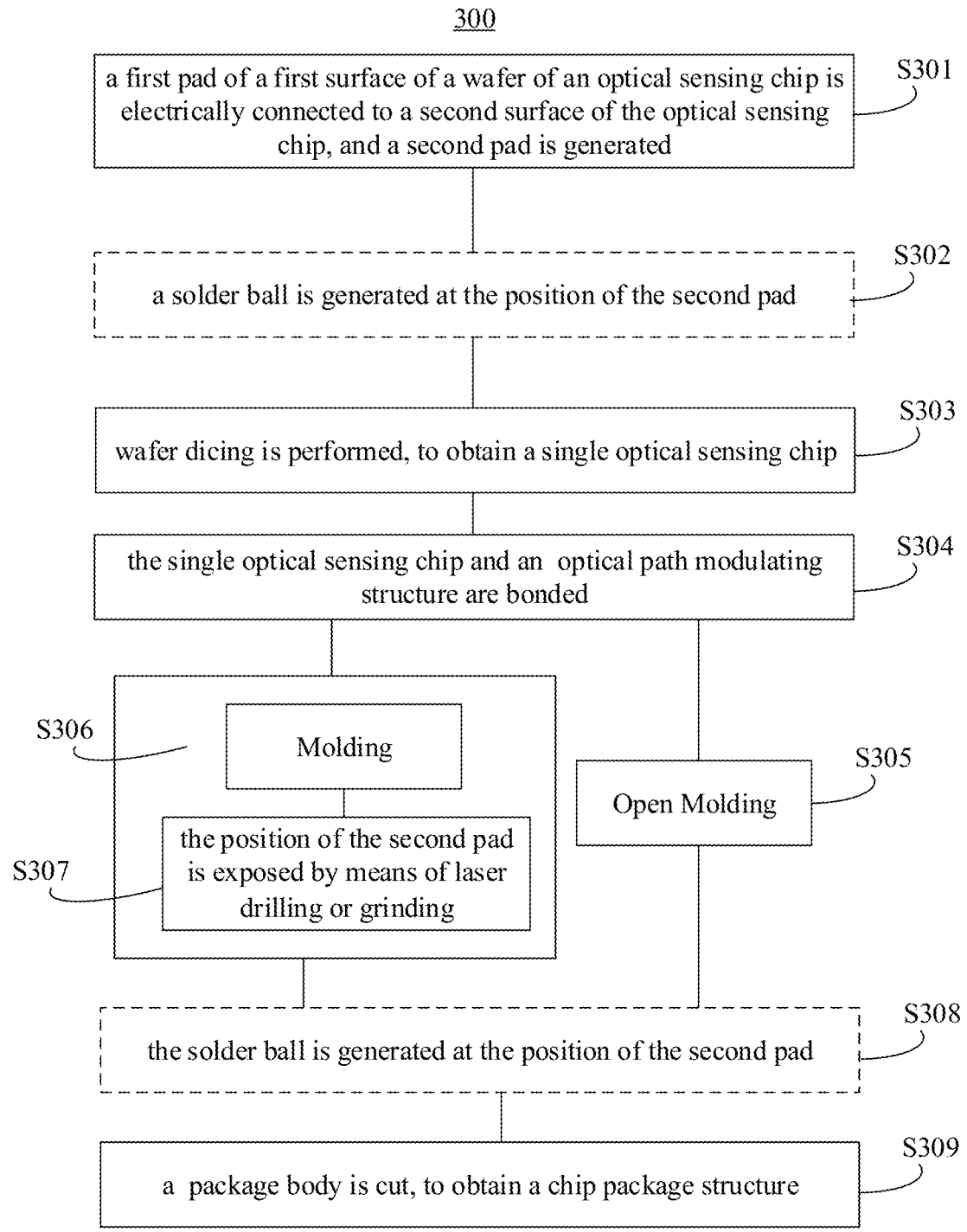
FIG. 10 is a schematic flowchart of a chip package method according to another embodiment of the present application.

It should be understood that, FIGS. 9-10 illustrate specific steps or operations of the chip package methods of the embodiments of the present application, however, these steps or operations are only examples, and other operations or variants of various operations of FIGS. 9 and 10 may also be performed in the embodiments of the present application. In addition, each step of FIGS. 9-10 can be performed according to different orders presented in FIGS. 9-10, respectively, and it is possible not to perform all of the operations of FIGS. 9-10.

As shown in FIG. 9, a method 200 includes the following content:

It should be understood that, the chip package method 200 shown in FIG. 9 may correspond to the package method I to the package method IV described above, thus a detailed description of the same steps is omitted for brevity.

S201, a wafer of an optical sensing chip and a wafer of an optical path modulating structure are bonded.

The wafer of the optical sensing chip and the wafer of the optical path modulating structure which are bonded herein is referred to as a reconstructed wafer.

S202, a first pad of a first surface of the optical sensing chip is electrically connected to a second surface of the optical sensing chip, and a second pad is generated.

The executing procedures of S201 and S202 may refer to the relevant description of the package method I to the package method IV of the foregoing embodiments, and for brevity, it will not be repeated redundantly herein.

Optionally, a step S203 may further be performed after S202, i.e., a solder ball is generated at the position of the second pad; for instance, the solder ball may be generated at the position of the second pad using a ball placement process, or a stencil printing process combined with a reflow soldering process, and it is not limited in the embodiments of the present application.

Then, in S204, wafer dicing is performed on the reconstructed wafer after the above processing, to obtain a die package particle; if the step S203 is included, then the obtained die package particle may be the chip package structure 10 shown in FIG. 4; if the step S203 is not included, then the obtained die package particle may be the chip package structure 10 shown in FIG. 1 or 2.

Therefore, the chip package method of the embodiment of the present application may merely include the above steps S201-S204, or it may also merely include S201, S202 and S204, such that the chip package structures as shown in FIG. 4, FIG. 1 or FIG. 2 may be obtained.

Optionally, in some possible embodiments, the die package particle may further be processed, to obtain chip package structures in other forms; for instance, an injection molding layer may be coated in the periphery of the die package particle, to fix and protect the optical sensing chip and the optical path modulating structure corresponding thereto.

As one embodiment, in S205, the die package particle is processed using an Open Molding process, to form the injection molding layer; under such circumstance, the formed injection molding layer does not coat the position of the second pad or solder ball, i.e., the position of the second pad or solder ball is exposed from the injection molding layer; therefore, an electrical connection between the second pad or solder ball and the exterior may be implemented without further processing the injection molding layer.

As another embodiment, in S206, the die package particle is processed using a Molding process, to form the injection molding layer; under such circumstance, the position of the second pad or solder ball is covered by the injection molding layer, or the position of the second pad or solder ball is not exposed from the surface of the injection molding layer.

Furthermore, in S207, the position of the second pad or solder ball is exposed from the injection molding layer by means of laser drilling or grinding.

If S203 is not performed in the foregoing steps, the obtained structure does not include the solder ball; if the customer requires that the electrical connection between the optical sensing chip and the exterior is implemented in the form of solder ball, then S208, i.e., the solder ball is implanted at the position of the second pad, may be performed after S205 or S207, i.e., the solder ball may be implanted after S202, S205 or S207. Or the solder ball may not be implanted, i.e., S203 and S208 are not performed.

If the molding procedure is performed on a plurality of package particles, then the injection molding layers of the plurality of package particles are connected together; thus in a step S209, the injection molding layers of the plurality of package particles are cut, to obtain a die package body, and the die package body herein may be the chip package structures 10 shown in FIGS. 5-8.

In general, the chip package method 200 of the embodiment of the present application may be formed in the following steps:
1. S201, S202 and S204;
2, S201-S204;
3. S201, S202, S204, S205 and S209;
4. S201, S202, S204, S205, S208 and S209;
5. S201, S202, S204, S206, S207 and S209;
6. S201, S202, S204, S206, S207, S208 and S209;
7, S201-S205 and S209;
8. S201-S204, S206, S207 and S209.

It should be understood that, the chip package method of the embodiment of the present application may also be other replacements or equivalent variation forms of various operations in the above steps, and the embodiment of the present application does not define the operation process or operation manner used by each step.

FIG. 10 is a schematic flowchart of a chip package method 300 according to another embodiment of the present application. As shown in FIG. 10, the method 300 includes the following steps:

It should be understood that, the chip package method 300 of the embodiment of the present application may correspond to the package method V described above, thus a detailed description of the same steps is omitted for brevity.

S301, a first pad of a first surface of a wafer of an optical sensing chip is electrically connected to a second surface of the optical sensing chip, and a second pad is generated.

Optionally, a step S302 may further be performed after S301, i.e., a solder ball is generated at the position of the second pad; for instance, the solder ball may be generated using a ball placement process, or a stencil printing process combined with a reflow soldering process, and it is not limited in the embodiments of the present application.

Then, in S303, wafer dicing is performed on the reconstructed wafer after above processing, to obtain a single optical sensing chip.

Furthermore, in S304, the single optical sensing chip and the optical path modulating structure corresponding thereto are bonded. Specifically, the optical path modulating structure is placed on a carrier, a light transmissive adhesive material is coated on the surface of the optical path modulating structure, and a first surface of the single optical sensing chip is pasted to a surface of the optical path modulating structure, where the surface is coated with the adhesive material, thereby realizing the optical sensor chip and the optical path modulation structure to be combined together, which is recorded as a die package particle.

In some possible embodiments, the die package particle may further be processed, to obtain chip package structures in other forms; for instance, an injection molding layer may be coated in the periphery of the die package particle, to fix and protect the optical sensing chip and the optical path modulating structure corresponding thereto.

The executing procedures of S305-S309 in the method 300 are similar to the executing procedures of S205-S209 in the method 200, which will not be repeated redundantly herein.

In general, the chip package method 300 of the embodiment of the present application may be formed in the following steps:
1. S301, S303 and S304;
2, S301-S304;
3. S301, S303, S304, S305 and S309;
4. S301, S303, S304, S305, S308 and S309;
5. S301, S303, S304, S306, S307 and S309;
6. S301, S303, S304, S306, S307, S308 and S309;

7, S301-S305 and S309;

8. S301-S304, S306, S307 and S309.

It should be understood that, the chip package method of the embodiment of the present application may also be other replacements or equivalent variation forms of various operations in the above steps, and the embodiment of the present application does not define the operation process or operation manner used by each step.

It should also be understood that, each embodiment of the chip package methods listed above may be performed by a robot or numerical control machine. The device software or process for performing the chip package methods may perform the above chip package methods by performing the computer program code stored in the memory.

Figure 11:
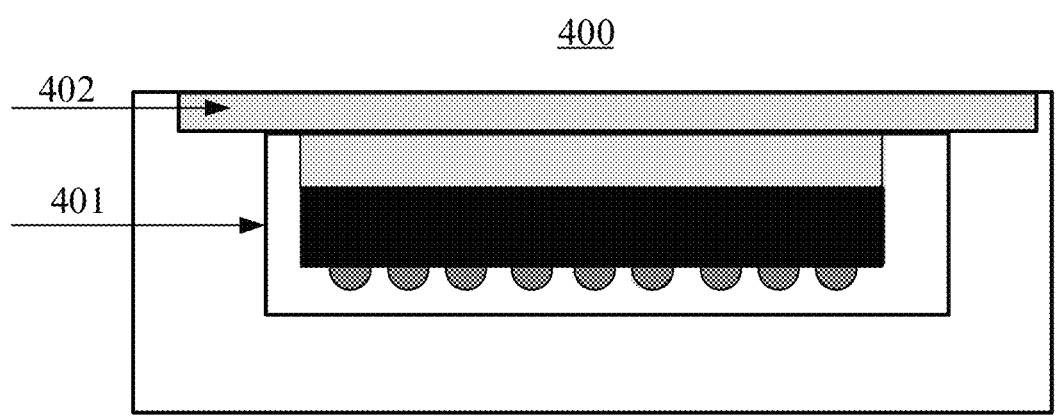
FIG. 11 is a side view of a terminal device according to an embodiment of the present application.

An embodiment of the present application provides a terminal device. FIG. 11 is a side view of a terminal device 400 of an embodiment of the present application. As shown in FIG. 11, the terminal device may include a chip package structure 401, and the chip package structure 401 may be the chip package structures 10 as described above, or a chip package structure prepared according to the chip package method 200 or the chip package method 300 as described above.

Specifically, the chip package structure 401 may include an optical path modulating structure and an optical sensing chip; a connecting end for performing an electrical connection to the exterior is disposed on a second surface of the optical sensing chip; the optical path modulating structure may perform an optical path modulation on an optical signal entered into the chip package structure; the optical sensing chip may acquire an optical image signal of a human finger, convert it into an electric signal, and output the acquired fingerprint information of the human finger to a chip electrically connected to the connecting end through the connecting end, such as a processing chip of the terminal device, so that the processing chip performs fingerprint identification and other subsequent operations according to the fingerprint information.

Optionally, the terminal device 400 may further include a screen 402, and the chip package structure 401 is disposed below the screen 402.

Optionally, the terminal device 400 may be a terminal device such as a mobile phone, a tablet computer or an electronic book.

It should be understood that, in various embodiments of the present application, values of sequence numbers of the above-mentioned various processes do not mean an order of execution which should be determined based upon functionalities and internal logics thereof, rather than setting any limitation to implementation of the embodiment of the present application.

Those of ordinary skill in the art may be aware that, units and algorithm steps of the examples described in the embodiments disclosed in this paper may be implemented by electronic hardware, computer software, or a combination of the two. Whether these functions are executed in hardware or software mode depends on the specific applications and design constraint conditions of the technical solution. Those skilled may implement the described functions by using different methods for each specific application, but this implementation should not be considered to be beyond the scope of the present application.

Those skilled in the art to which the present invention pertains may clearly understand that, for the convenience and simplicity of description, for the specific working processes of the system, the apparatus and the units described above, may refer to corresponding processes in the foregoing method embodiments, and will not be repeated redundantly herein.

In the several embodiments provided in the present application, it should be understood that, the disclosed system, apparatus and method may be implemented in other manners. For example, the apparatus embodiments described above are merely exemplary, e.g., the division of the units is merely a logic function division, other division manners may exist in practical implementation, for example, a plurality of units or components may be combined or integrated to another system, or some features may be omitted or not implemented. From another point of view, the displayed or discussed mutual coupling or direct coupling or communication connection may be indirect coupling or communication connection via some interfaces, apparatuses or units, and may be in electrical, mechanical or other forms.

The units described as separate parts may be or may not be separated physically, and a component displayed as a unit may be or may not be a physical unit, namely, may be located in one place, or may be distributed on a plurality of network units. A part of or all of the units may be selected to achieve the purposes of the solutions in the present embodiments according to actual demands.

In addition, the respective functional units in the embodiments of the present application may be integrated in a processing unit, or the respective units exist separately and physically, or two or more units are integrated in one unit.

Described above are the specific embodiments of the present application only, but the protection scope of the present application is not limited to this, those skilled who are familiar with the art could readily think of variations or substitutions within the technical scope disclosed by the present application, and these variations or substitutions shall fall within the protection scope of the present application. Therefore, the protection scope of the present application should be determined with reference to the protection scope of the claims.

What is claimed is:

1. A chip package structure, comprising:
    an optical sensing chip, comprising a first surface and a second surface, wherein the first surface is provided with a first pad, the second surface is provided with a connecting end, a Through Silicon Via (TSV) is disposed between the first pad and the connecting end, and the first pad is electrically connected to the connecting end through a Redistribution Layer (RDL) in the TSV, and the connecting end is configured to implement an electrical connection between the chip package structure and exterior; and
    an optical path modulating structure, disposed above the first surface, and configured to perform an optical path modulation on an optical signal reflected from a human finger and make the signal incident on the first surface, or perform an optical path modulation on an optical signal emitted from the first surface and make the signal exit to the human finger.

2. The chip package structure according to claim 1, wherein the chip package structure further comprises:
    an injection molding layer, coating the optical sensing chip and the optical path modulating structure, and configured to fix and protect the optical sensing chip and the optical path modulating structure.

3. The chip package structure according to claim 2, wherein the connecting end is exposed from the surface of the injection molding layer.

4. The chip package structure according to claim 2, wherein the injection molding layer is a plastic sealant.

5. The chip package structure according to claim 1, wherein the optical path modulating structure is a lens structure.

6. A chip package method, comprising:
bonding a wafer of an optical path modulating structure and a wafer of an optical sensing chip, to obtain a reconstructed wafer, wherein the wafer of the optical sensing chip comprises a plurality of optical sensing chips;
electrically connecting a first pad of a first surface of the optical sensing chip in the reconstructed wafer to a second surface of the optical sensing chip, and generating a second pad, wherein the second pad is configured to implement an electrical connection between the optical sensing chip and exterior; and
performing wafer dicing on the processed reconstructed wafer, to obtain a die package particle;
wherein the electrically connecting the first pad on the first surface of the optical sensing chip in the reconstructed wafer to the second surface of the optical sensing chip, and generating the second pad comprises:
disposing a TSV between the first pad and the second surface using a Through Silicon Via (TSV) process; and
electrically connecting the first pad to the second surface through a Redistribution Layer (RDL) in the TSV, and generating the second pad.

7. The chip package method according to claim 6, wherein the method further comprises:
performing molding processing on the die package particle, and forming an injection molding layer in the periphery of the die package particle, wherein the injection molding layer is configured to fix and protect the optical sensing chip and the optical path modulating structure; and
exposing the position of the second pad from a surface of the injection molding layer by means of grinding or laser drilling.

8. The chip package method according to claim 6, wherein the method further comprises:
performing open molding processing on the die package particle, and forming an injection molding layer in the periphery of the die package particle, wherein the injection molding layer is configured to fix and protect the optical sensing chip and the optical path modulating structure.

9. The chip package method according to claim 6, wherein the method further comprises:
forming a solder ball at the position of the second pad using a stencil printing process combined with a reflow soldering process, or a ball placement process.

10. A chip package method, comprising:
electrically connecting a first pad of a first surface of an optical sensing chip in a wafer of the optical sensing chip to a second surface of the optical sensing chip, and generating a second pad, wherein the second pad is configured to implement an electrical connection between the optical sensing chip and exterior, and the wafer of the optical sensing chip comprises a plurality of optical sensing chips;
performing wafer dicing on the processed wafer of the optical sensing chip, to obtain a single optical sensing chip; and
bonding the single optical sensing chip and an optical path modulating structure, to obtain a die package particle;
wherein the electrically connecting the first pad on the first surface of the optical sensing chip in the wafer of the optical sensing chip to the second surface of the optical sensing chip, and generating the second pad comprises:
disposing a Through Silicon Via (TSV) between the first pad and the second surface using a TSV process; and
electrically connecting the first pad to the second surface through a Redistribution Layer (RDL) in the TSV, and generating the second pad.

11. The chip package method according to claim 10, wherein the method further comprises:
performing molding processing on the die package particle, and forming an injection molding layer in the periphery of the die package particle, wherein the injection molding layer is configured to fix and protect the optical sensing chip and the optical path modulating structure; and
exposing the position of the second pad from a surface of the injection molding layer by means of grinding or laser drilling.

12. The chip package method according to claim 10, wherein the method further comprises:
performing open molding processing on the die package particle, and forming an injection molding layer in the periphery of the die package particle, wherein the injection molding layer is configured to fix and protect the optical sensing chip and the optical path modulating structure.

13. A terminal device, comprising:
the chip package structure according to claim 1.

14. The terminal device according to claim 13, wherein the terminal device further comprises a screen, and the chip package structure is disposed below the screen.

* * * * *